United States Patent
Habuka

[19]
[11] Patent Number: 5,913,974
[45] Date of Patent: Jun. 22, 1999

[54] HEAT TREATING METHOD OF A SEMICONDUCTOR SINGLE CRYSTAL SUBSTRATE

[75] Inventor: Hitoshi Habuka, Maebashi, Japan

[73] Assignee: Shin-Etsu Handotai Co., Ltd., Tokyo, Japan

[21] Appl. No.: 08/945,413

[22] PCT Filed: Jan. 23, 1997

[86] PCT No.: PCT/JP97/00143

§ 371 Date: Oct. 29, 1997

§ 102(e) Date: Oct. 29, 1997

[87] PCT Pub. No.: WO97/33306

PCT Pub. Date: Sep. 12, 1997

[30] Foreign Application Priority Data

Mar. 7, 1996 [JP] Japan ................................. 8-049697

[51] Int. Cl.⁶ ...................................................... C30B 33/02
[52] U.S. Cl. ........................................ 117/3; 117/2; 117/7
[58] Field of Search ............................ 117/2, 3, 4, 89, 117/106

[56] References Cited

U.S. PATENT DOCUMENTS 4,738,935  4/1988  Shimbu et al. ............................ 117/1

FOREIGN PATENT DOCUMENTS

| 59-169126 | 9/1984 | Japan . |
| 60-27115 | 2/1985 | Japan . |
| 60-137027 | 7/1985 | Japan . |
| 3-278524 | 12/1991 | Japan . |

*Primary Examiner*—Felisa Hiteshew
*Attorney, Agent, or Firm*—Nikaido, Marmelstein, Murray & Oram LLP

[57] ABSTRACT

A heat treating method in which the ultimate temperature of semiconductor single crystal substrates being heat treated is made constant. The method includes heating at least the back surface of the substrate directly with radiant heat. The heating output is controlled according to the reflectivity of the back surfaces of the semiconductor single crystal substrates. In particular, the heating output is increased or decreased in proportion to the increase or decrease in the reflectivity of the back surface of the substrates from one substrate to the next. The method makes its possible to keep a uniform crystal quality throughout the heat treated semiconductor single crystal substrates.

7 Claims, 7 Drawing Sheets

HEAT TREATING METHOD OF A SEMICONDUCTOR SINGLE CRYSTAL SUBSTRATE

TECHNICAL FIELD

The present invention relates to a method of heat treating semiconductor single crystal substrates uniformly, and a semiconductor single crystal substrate which is readily capable of being heated uniformly.

BACKGROUND ART

Conventionally, in pursuing a heat treatment of semiconductor single crystal substrates by radiant heating, a susceptor containing graphite as a chief material and coated with silicon carbide (SiC) is placed within a silica glass container. Then, semiconductor single crystal substrates are held on the susceptor while the back surface of each substrate is kept in close contact with the susceptor over the entire area thereof. The semiconductor single crystal substrates together with the susceptor are heated with radiant light emitted from a radiant heating means, such as an infrared lamp to thereby perform the heat treatment at a desired temperature.

However, the susceptor containing graphite as a chief material is often contaminated with metals, and it could be also water contaminated. As the temperature goes up by heating, the contaminants or impurities are released from the susceptor and admixed with a reaction gas or atmosphere. If the impurities were incorporated in the semiconductor single crystal substrates being heat treated, the quality of the semiconductor single crystal substrates would be deteriorated.

Furthermore, when an attempt is made to heat the semiconductor single crystal substrates uniformly over the entire area thereof by the use of the susceptor containing graphite as a chief material, the susceptor is required to have a greater size than the substrates to be heat treated. Since such a great susceptor has a large thermal capacity, it takes a long time to heat the susceptor to the desired temperature. The long heating time, however, affects the productivity and, accordingly, an appropriate improvement is needed.

To cope with this difficulty, it has been proposed a method in which semiconductor single crystal substrates are directly heated with radiant light emitted from infrared lamps, for example, while the substrates are disposed within a silica glass container, with a portion of the back surface or a portion of the periphery held in position without using a susceptor. The proposed method has a problem however that when the substrates are heated to the desired heat treating temperature, an ultimate temperature reached at this time varies depending on the individual substrates being heat treated.

From a close study and investigation of the phenomenon, in which direct heating of the back surface of semiconductor single crystal substrates with radiant light tends to vary the ultimate temperature of the individual substrates being heat treated, the present inventor has found that it is caused due to the reflectivity of the back surface of the semiconductor single crystal substrates which is variable with the individual substrates. Based on this finding, the present inventor has completed the present invention.

It is an object of the present invention to provide a heat treating method in which semiconductor single crystal substrates being heat treated are able to have a constant ultimate temperature, thereby making it possible to maintain a uniform crystal quality throughout the semiconductor single crystal substrates being heat treated, and a semiconductor single crystal substrate which is able to realize uniform heating easily by a radiant heating means.

DISCLOSURE OF THE INVENTION

To solve the foregoing problem, the present invention in a first aspect provides a heat treating method wherein at least the back surface of a semiconductor single crystal substrate is directly heated by radiant heating, characterized in that the heating output is controlled according to the reflectivity of the back surface of the semiconductor single crystal substrate.

As a means for controlling the heating output according to the reflectivity of the back surface of the semiconductor single crystal substrate, the reflectivity of the back surface of each individual semiconductor single crystal substrate to be heat treated in a single wafer heat treatment is measured in advance, and the heating output is increased or decreased in proportion to an increase or a decrease in the reflectivity of the back surface of substrates to be replaced for each individual single wafer heat treatment.

The semiconductor single crystal substrate may be a silicon substrate in which instance the reflectivity of the back surface of the silicon substrate is variable (increases and decreases) within the range of 33% at maximum.

In a second aspect the present invention provides a heat treating method wherein at least the back surface of a semiconductor single crystal substrate is directly heated by radiant heating, characterized in that the reflectivity of the back surface of the semiconductor single crystal substrate to be heat treated is kept constant for each substrate.

A semiconductor single crystal substrate of the present invention is characterized in that the back surface of the substrate has a reflectivity which is lower in a peripheral portion than a central portion of the substrate.

The semiconductor single crystal substrate may be a silicon substrate, the back surface of said substrate has a reflectivity of 33% at maximum, and the reflectivity decreases in a radial direction of the substrate toward the peripheral portion of the substrate.

The reflectivity of the semiconductor single crystal substrate can be controlled by adjusting the surface roughness of the substrate. Polishing, lapping, etching or the like surface finishing process may be employed to prepare surfaces of different reflectivities. Different reflectivities can be also provided by a film material, such as an oxide film and a nitride film. When a substrate surface is fully dim or lusterless, the reflectivity of the substrate surface is 0%. On the other hand, when a substrate surface is mirror-finished, the reflectively of the substrate surface is 33%. As a means for controlling the reflectivity of the substrate surface, it is possible to use an oxide film, a nitride film or a polysilicon formed by CVD (chemical vapor deposition).

BEST MODE FOR CARRYING OUT THE INVENTION

The present invention will be described below in greater detail with reference to the accompanying drawings.

Figure 1:
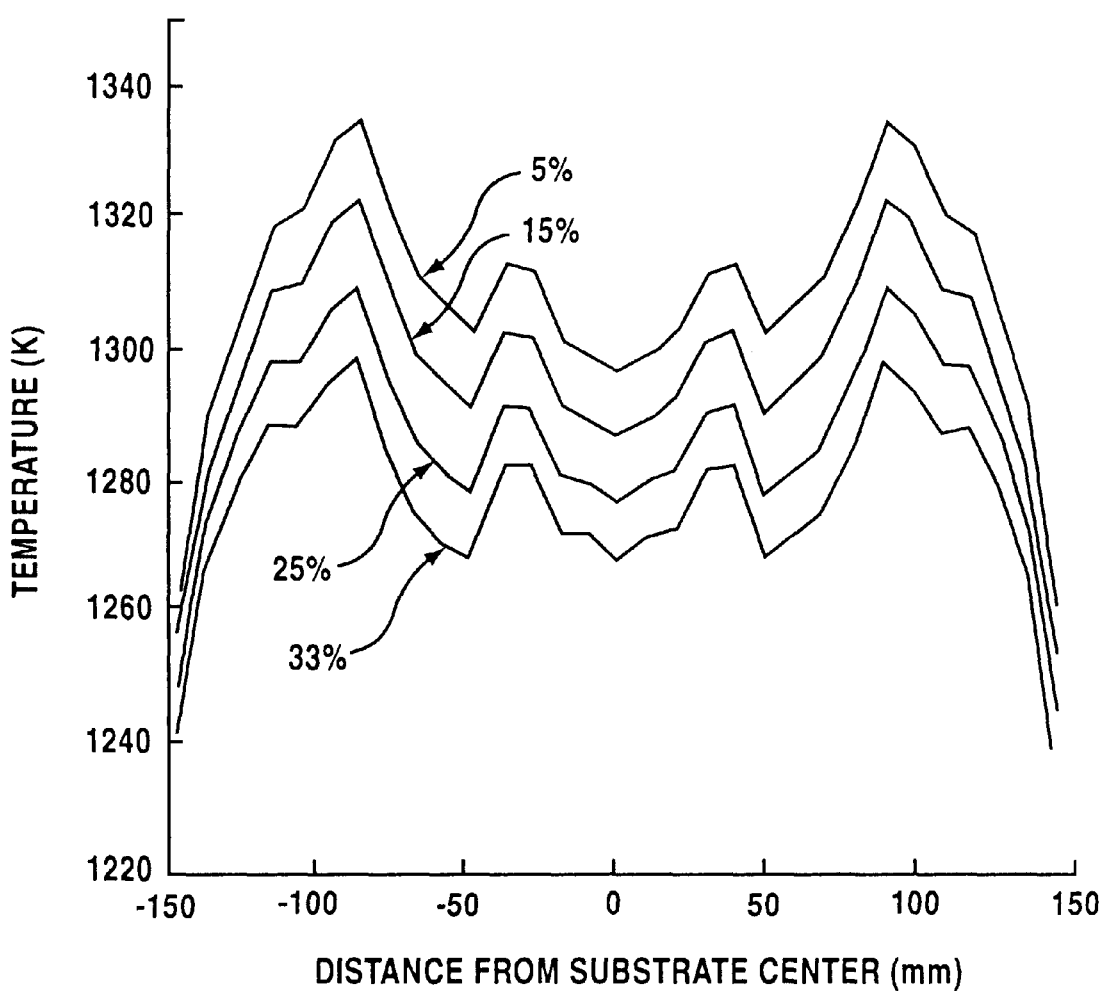
FIG. 1 is a graph showing the in-plane distribution of substrate temperatures obtained by calculation in the case where the reflectivity of the back surface of a substrate is changed in a virtual heating process of the substrate achieved by a virtual heating apparatus.
Figure 2:
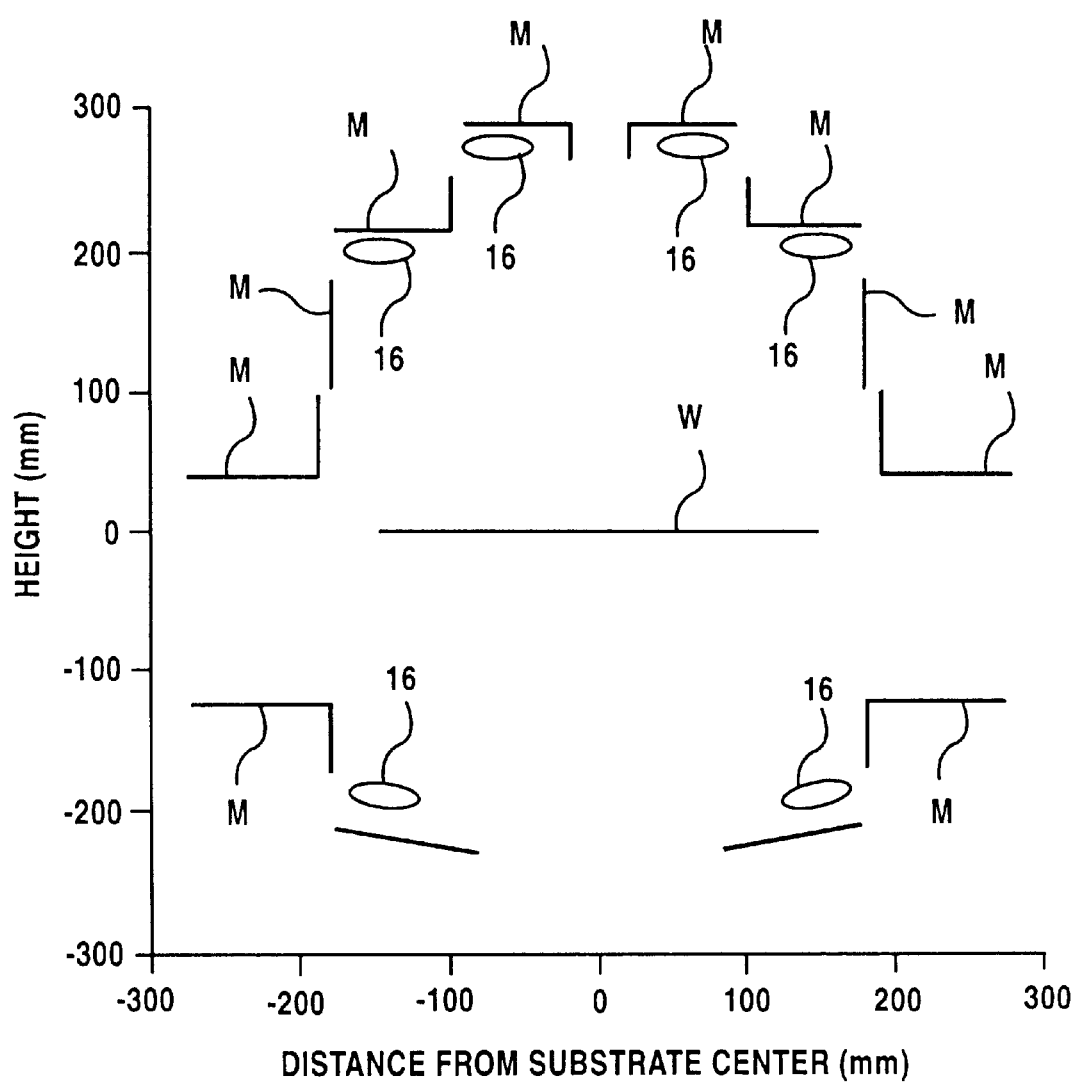
FIG. 2 is a view showing the virtual heating apparatus used to prepare the graph shown in FIG. 1.

FIG. 1 is prepared on the assumption that a heat treatment is performed while a 300-mm-diameter silicon single crystal substrate W having mirror-finished principal surfaces is disposed at the center of a virtual heating apparatus having a structure and dimensions shown in FIG. 2, and it shows the manner in which the temperature of the substrate varies with the reflectivity of the back surface of the substrate, the manner being determined by calculation based on the intensity of light arrived and the quantity of heat absorbed by the substrate. In FIG. 2, 16 denotes a radiant heating means (such as an infrared lamp), and M denotes a mirror.

In the calculation used to prepare FIG. 1, the reflectivity of the back surface of the substrate is changed between 5%, 15%, 25% and 33%. A 5% reflectivity represents the condition in which the substrate surface is substantially dim or lusterless, and a 33% reflectivity represents the condition in which the substrate surface forms a perfect mirror surface.

It appears clear from FIG. 1 that as the reflectivity of the back surface of the substrate decreases, the radiant energy emitted from the lamps on the back surface of the substrate is absorbed increasingly, thereby tending to rise the ultimate temperature of the substrate. From the same Figure, it is also seen that the ultimate temperature rises at an increment of about 10° C. per every 10% decrease in reflectivity of the back surface of the substrate.

In the case where a semiconductor single crystal substrate is heat treated by heating at least the back surface of the substrate directly with radiant heat, the ultimate temperature of the substrate varies with the reflectivity of the back surface of the substrate to be heat treated. Accordingly, in order to make the ultimate temperature constant, the reflectivity of the back surface of the substrate to be heat treated is kept constant, or the heating output is controlled according to the reflectivity of the back surface of the substrate.

Figure 3:
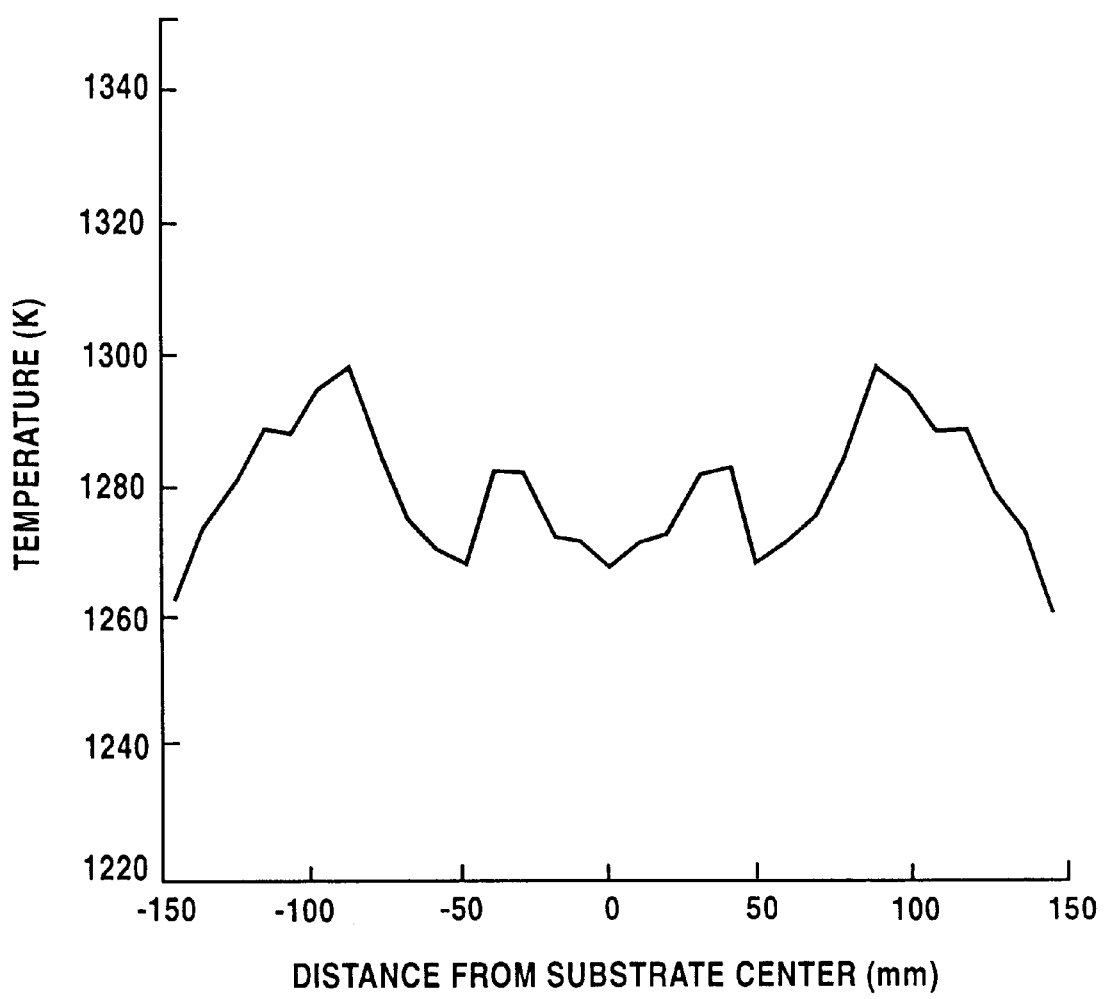
FIG. 3 is a graph similar to FIG. 1, showing the in-plane distribution of substrate temperatures determined when the reflectivity of the back surface of a substrate is decreased in a radial direction toward a peripheral portion of the substrate.
Figure 9:
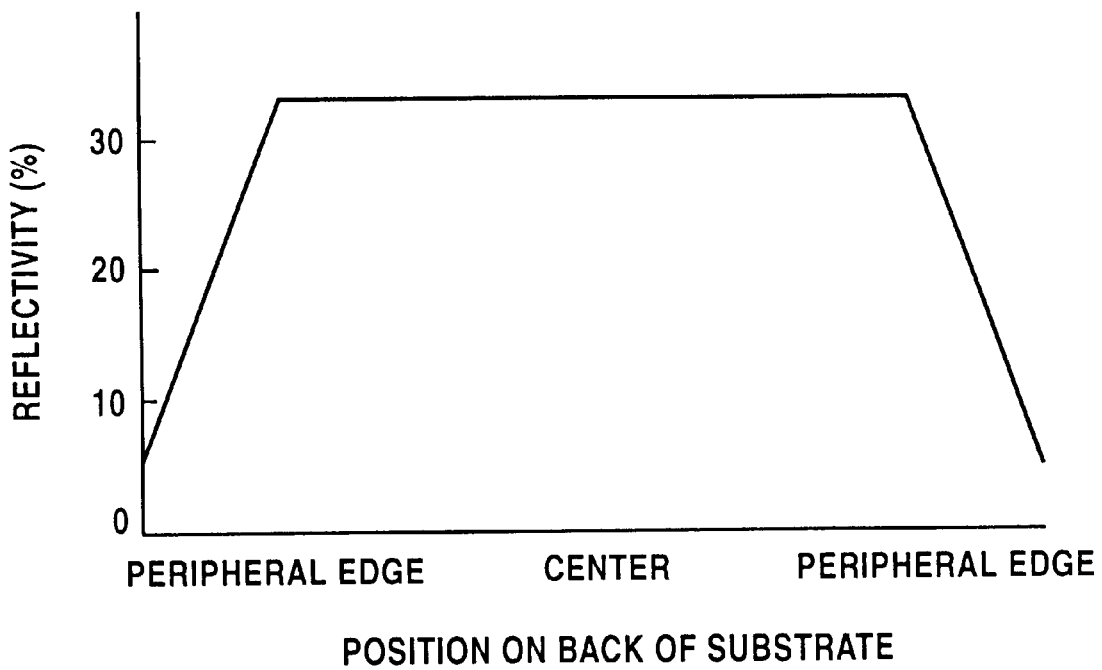
FIG. 9 is a graph showing one example of the relationship between the position and the reflectivity on the back surface of a substrate having a reflectivity decreasing in a radial direction of the substrate toward a peripheral portion thereof.

FIG. 3 shows the results of a further consideration made on the basis of the results of calculation shown in FIG. 1. More specifically, this Figure shows the in-plane distribution of temperatures of a substrate that can be reached when, as shown in FIG. 9, the back surface of the substrate has a reflectivity of 33% at a central portion extending within the range of 30 mm about the center of the substrate, a varying reflectivity gradually decreasing in a radial direction of the substrate from the central portion toward a peripheral portion of the substrate, and a reflectivity of 5% at the peripheral portion. It is seen from FIG. 3 that the temperature distribution is improved by about 20° C. at the peripheral portion of the substrate, as compared to the case of FIG. 1 in which the reflectivity is set at 33% over the entire area of the back surface of the substrate.

A further description of the present invention will be given by way of the following examples. In Experimental Examples and Example described below, a silicon single crystal substrate is used as a sample of the semiconductor single crystal substrate.

EXPERIMENTAL EXAMPLE 1

(Relation between a change in reflectivity of the back surface of a silicon single crystal substrate and a change in temperature of the silicon single crystal substrate)

The surface roughness of the back surface of a silicon single crystal substrate was changed to vary the reflectivity of the back surface of the substrate in the range of from 5 to 33%.

Figure 4:
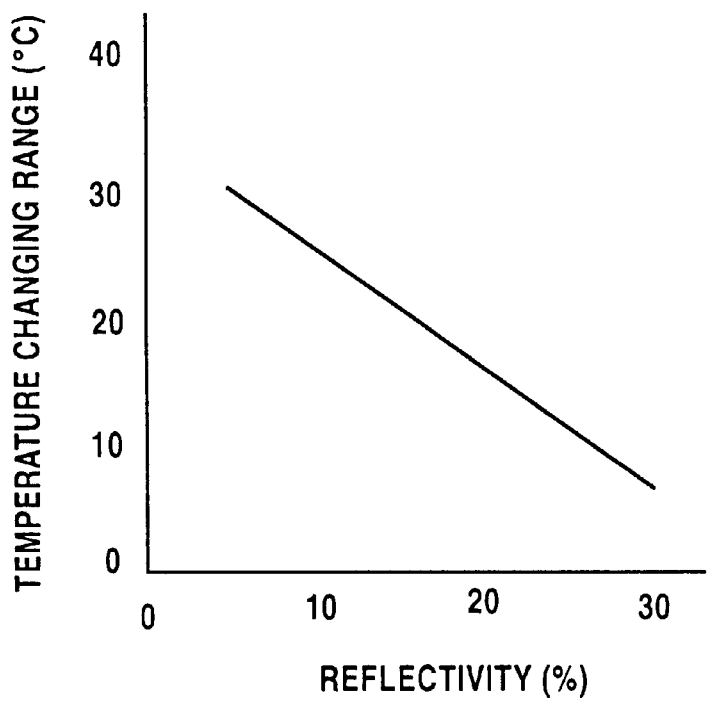
FIG. 4 is a graph showing the relationship between the reflectivity of the back surface of a silicon single crystal substrate and the range of a temperature change according to Experimental Example 1.
Figure 5:
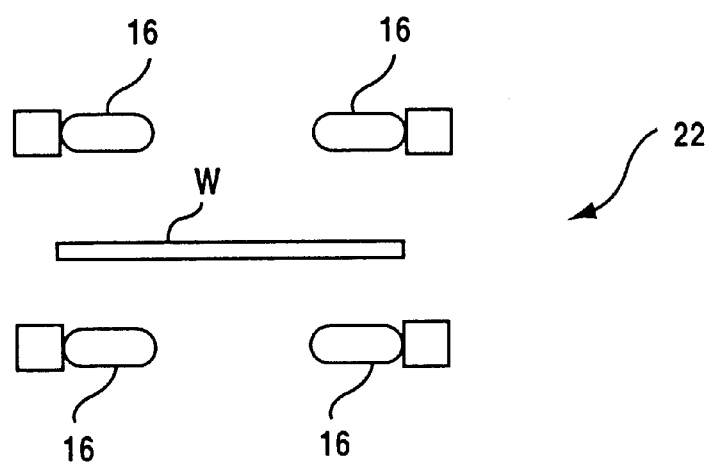
FIG. 5 is a diagrammatical explanatory view showing a radiant heating apparatus used in Experimental Example 1.

Using a radiant heating apparatus 22 equipped with infrared lamps 16 as shown in FIG. 5, the silicon single crystal substrate W was heated to about 1,000° C., and the temperature of the silicon single crystal substrate W was measured by thermocouples (not shown) embedded in the silicon single crystal substrate W. The results of this measurement are shown in FIG. 4. From FIG. 4, it is clearly seen that the temperature of the silicon single crystal substrate decreases as the reflectivity of the back surface of the silicon single crystal substrate increases.

EXPERIMENTAL EXAMPLE 2

(Relation between a change in reflectivity of the back surface of a silicon single crystal substrate and the range of a variation of the epitaxial growth rate)

Figure 6:
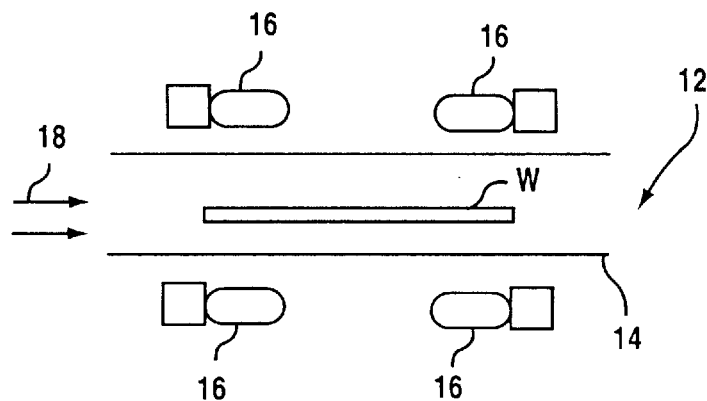
FIG. 6 is a diagrammatical explanatory view showing an epitaxial growth system used in Examples 1 and 2.

Description will be given first of a growth system used in this Experimental Example. The growth system 12, as shown in FIG. 6, includes a transparent silica glass container 14. Designated by 16 is a radiant heating means (such as an infrared lamp) which is disposed exteriorly of the silica glass container 14 at an upper or a lower side of the container 14 in confronting relation to a similar radiant heating means.

A silicon single crystal substrate W is mounted within the silica glass container 14 and it is heated from above and below by radiant heat emitted from the oppositely disposed infrared lamps 16. In a process of growing an epitaxial film on the silicon single crystal substrate W, a reaction gas 18 consisting of a source gas such as trichlorosilane ($SiHCl_3$) and a carrier gas such as hydrogen is introduced into the silica glass container 14 (from the left on the drawing Figure).

Based on the knowledge obtained in Experimental Example 1, a measurement was made to determine a range of variation of the epitaxial growth rate observed when the reflectivity of the back surface of the silicon single crystal substrate was changed while the output of the infrared lamps of the growth system 12 shown in FIG. 6 was kept constant throughout the heating process. By introducing the reaction gas 18 including a source gas of $SiHCl_3$ (22 grams per minute) admixed with hydrogen (100 liters per minute) in the transparent silica glass container 14, an epitaxial film of silicon was grown on the surface of the silicon single crystal substrate W. The reflectivity of the back surface of the silicon single crystal substrate W was changed within the range between 5 and 33%, and a silicon film was epitaxially grown on the silicon single crystal substrate W by using an infrared lamp output which is capable of providing a temperature of 1000° C. when the reflectivity of the back surface of the silicon single crystal substrate W is 5%.

Figure 7:
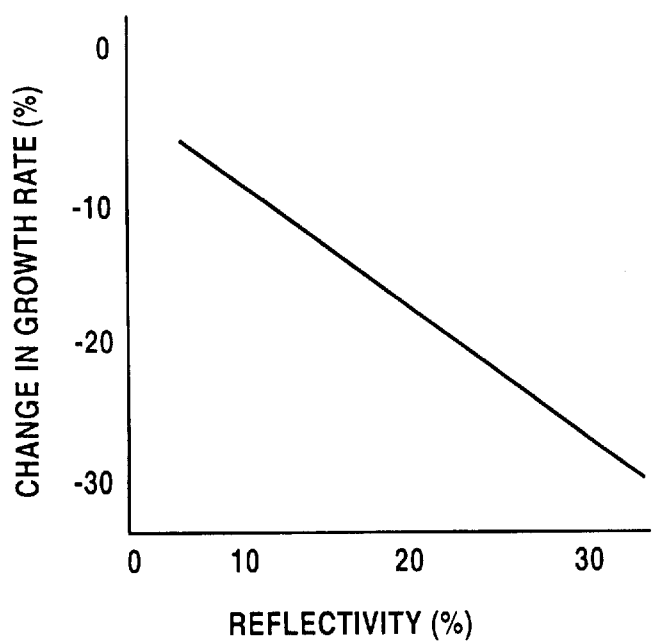
FIG. 7 is a graph showing the relationship between the reflectivity of the back surface of the silicon single crystal substrate and the range of a change in growth rate of an epitaxial film in Example 1.

At that time, a change in growth rate of the epitaxial film deposited on the silicon single crystal substrate W was measured with the results shown in FIG. 7. It is clearly seen from FIG. 7 that in order to restrict the change or variation of the epitaxial growth rate within the range of 5%, the change in reflectivity of the back surface of the silicon single crystal substrate should preferably be limited within the range of 5% or less.

The reflectivity measurement was done by the use of a spectrophotometer and based on the intensity ratio between standard light and reflected light coming back from the sample (silicon single crystal substrate). The reflection to be measured is mirror reflection only, and irregular reflection is excluded from the target of this measurement. The necessary reflectivity is a reflectivity at an emission wavelength (about 1 $\mu$m) of the infrared lamps.

EXAMPLE 1

Figure 8:
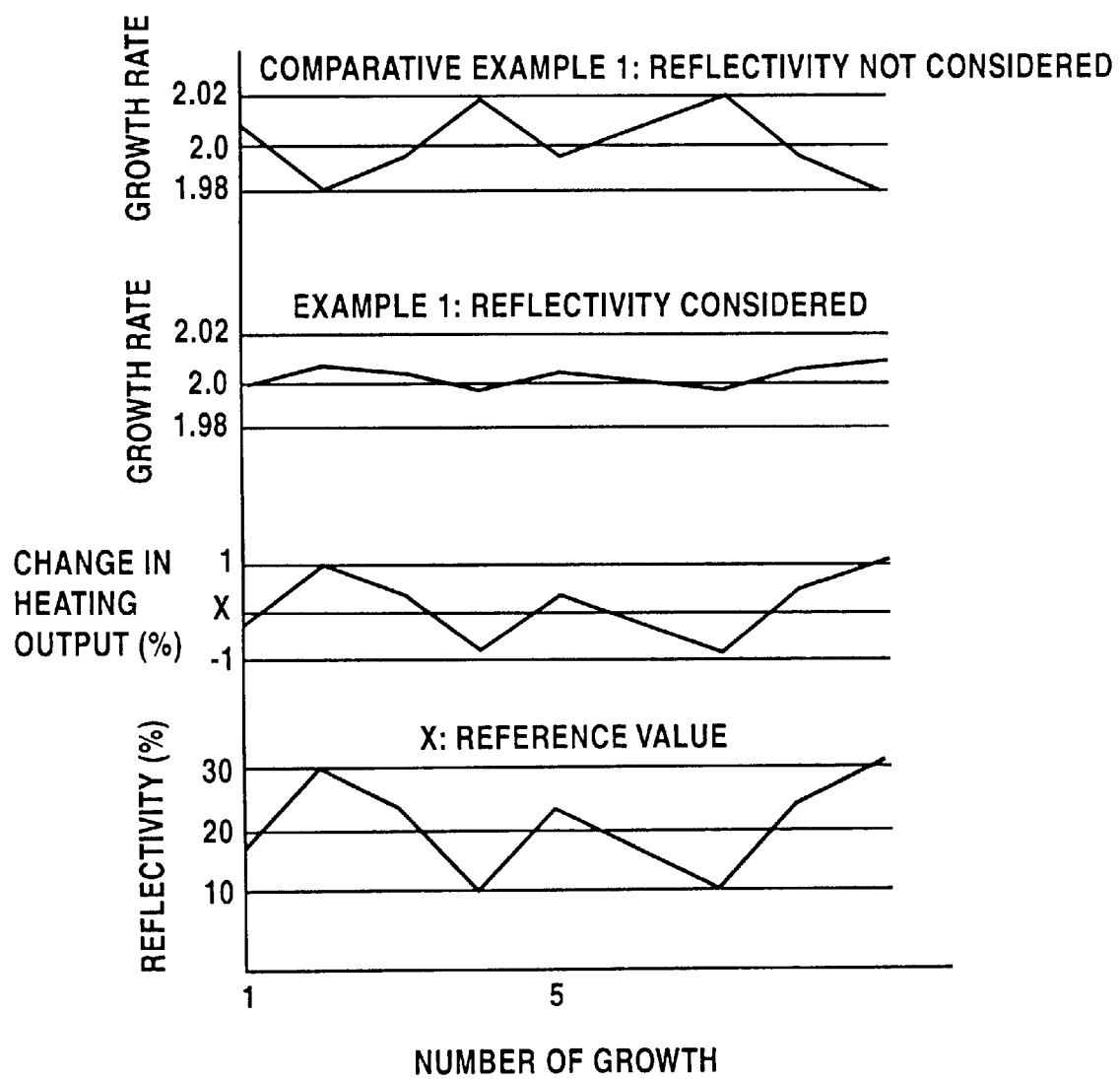
FIG. 8 is a graph showing a variation of growth rate observed when the heating output value is increased and decreased linearly with respect to an increase and a decrease in the reflectivity of the back surface of the silicon single crystal substrate in Example 2, and a variation of growth rate observed when the heating output value is set regardless of the reflectivity of the back surface of the silicon single crystal substrate in Comparative Example 1.

In the epitaxial growth system shown in FIG. 6, an epitaxial growth process was performed under the same condition as Experimental Example 2 except for a change in the reflectivity. At that time, the heating output value of the radiant heating means 16 was increased or decreased in proportion to an increase or a decrease in the value of reflectivity of the back surface of each individual silicon single crystal substrate W. In other words, when the reflectivity of the back surface of the silicon single crystal substrate W was high, the heating output of the radiant heating means 16 was increased. Conversely when the reflectivity of the back surface of the silicon single crystal substrate W was low, the heating output of the radiant heating means 16 was decreased. During the epitaxial growth process, the epitaxial growth rate was measured. The results of this measurement are shown in FIG. 8 together with a variation of the heating output and values of the reflectivity.

COMPARATIVE EXAMPLE 1

The growth rate was measured during an epitaxial growth process while the heating output was kept constant regardless of a change in the reflectivity. The results of this measurement are shown in FIG. 8 together with the results obtained in Example 1. It appears clear from FIG. 8 that as compared to the results obtained when the reflectivity of the back surface of the silicon single crystal substrate W is neglected from consideration (Comparative Example 1), the change or fluctuation of the growth rate can be restricted to a smaller range, as shown in FIG. 8, by taking account of the reflectivity of the back surface of the silicon single crystal substrate W (example 1).

FIG. 9 in considering the reflectivity of the back surface of the silicon single crystal substrate W, the reflectivity should be intended for use with the wavelength of radiant light emitted from the radiant heating means (infrared lamp, for example). Since the infrared lamp used in Example 1 has a dominant emission wavelength of 1 $\mu$m, a change in the reflectivity of the back surface of the silicon single crystal substrate W at about 1 $\mu$m should be used.

Capability of Exploitation in Industry

As described above, according to heat treating methods of the present invention, semiconductor single crystal substrates being heat treated are able to have a constant ultimate temperature, thereby making it possible to keep a uniform crystal quality throughout the heat treated semiconductor single crystal substrates. In addition, according to a semiconductor single crystal substrate of the invention, uniform heating by a radiant heating means can be easily realized.

I claim:

1. A method of heat treating a semiconductor single crystal substrate in a single wafer heat treatment by heating at least a back surface of the substrate directly with radiant heat, characterized in that a heating output is controlled according to a reflectivity of the back surface of the semiconductor single crystal substrate, wherein the reflectivity of the back surface of the semiconductor single crystal substrate is measured in advance, and the heating output is increased or decreased in proportion to an increase or a decrease in the reflectivity of the back surface of a substrate to be replaced for each individual single wafer heat treatment.

2. A method according to claim 1, wherein the semiconductor single crystal substrate is a silicon single crystal substrate, and the heating output is controlled such that an ultimate heating temperature of the silicon single crystal substrate rises at an increment of about 10° C. per every 10% decrease in reflectivity of the back surface of the substrate in a temperature range from 1240K to 1340K.

3. A method according to claim 2, wherein the back surface of the silicon single crystal substrate has a reflectivity of 33% at a maximum.

4. A method according to claim 2, wherein the heat treatment is in an epitaxial growth process.

5. A method of heat treating a semiconductor single crystal substrate by heating at least the back surface of the substrate directly with radiant heat under a constant heating output, characterized in that the reflectivity of the back surface of the semiconductor single crystal substrate to be heat treated is kept constant for each substrate.

6. A method according to claim 5, wherein the semiconductor single crystal substrate is a silicon single crystal substrate, and when a silicon film is epitaxially grown on the silicon single crystal substrate to be heat treated, a change in reflectivity of the back surface of the silicon single crystal substrate is limited within the range of 5% or less.

7. A method of heat treating a semiconductor single crystal substrate wherein a series of semiconductor single crystal substrates are individually subjected to a heat treatment by heating at least a back surface of the semiconductor single crystal substrates directly with radiant heat, characterized in that a heating output is controlled according to the reflectivity of the back surface of a semiconductor single crystal substrate presently being heat treated and a semiconductor single crystal substrate that was previously heat treated such that the reflectivity of the back surface of the semiconductor single crystal substrate presently being treated is measured in advance, and the heating output is increased or decreased in proportion to an increase or a decrease in the reflectivity of the back surface of the semiconductor single crystal substrate presently being treated as compared to the reflectivity of the back surface of the semiconductor single crystal substrate that was previously heat treated.

* * * * *